United States Patent
Lien et al.

(10) Patent No.: US 10,979,077 B2
(45) Date of Patent: *Apr. 13, 2021

(54) GENERATING HAMMING WEIGHTS FOR DATA

(71) Applicant: Seagate Technology LLC, Fremont, CO (US)

(72) Inventors: Nicholas Odin Lien, Shakopee, MN (US); Jay Allen Sheldon, Shakopee, MN (US); Ryan James Goss, Shakopee, MN (US); Ara Patapoutian, Shrewsbury, MA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/553,074

(22) Filed: Aug. 27, 2019

(65) Prior Publication Data
US 2020/0091937 A1    Mar. 19, 2020

Related U.S. Application Data

(63) Continuation of application No. 15/639,828, filed on Jun. 30, 2017, now Pat. No. 10,396,821.

(51) Int. Cl.
| | | |
|---|---|---|
| G11C 29/00 | (2006.01) | |
| H03M 13/15 | (2006.01) | |
| G06F 11/10 | (2006.01) | |
| H03M 13/11 | (2006.01) | |
| H03M 13/37 | (2006.01) | |
| H03M 13/45 | (2006.01) | |
| H03M 13/00 | (2006.01) | |
| G11C 29/52 | (2006.01) | |

(52) U.S. Cl.
CPC ..... *H03M 13/1575* (2013.01); *G06F 11/1012* (2013.01); *G06F 11/1068* (2013.01); *G06F 11/1076* (2013.01); *H03M 13/1108* (2013.01); *H03M 13/3707* (2013.01); *H03M 13/3723* (2013.01); *H03M 13/458* (2013.01); *H03M 13/6325* (2013.01); *G11C 29/52* (2013.01)

(58) Field of Classification Search
CPC .......... H03M 13/1575; H03M 13/1111; H03M 13/3723; G11C 11/5642; G11C 16/349; G11C 29/021; G11C 29/028; G11C 16/26; G11C 16/28; G11C 11/56; G11C 16/3454; G11C 7/14; G06F 11/1012; G06F 11/1068; G06F 11/1076; G06F 3/0634; G06F 3/0611; G06F 11/1402; G06F 3/0679; G06F 3/0659; G06F 3/0656

See application file for complete search history.

(56) References Cited

U.S. PATENT DOCUMENTS

| | | | | |
|---|---|---|---|---|
| 6,145,110 A | * | 11/2000 | Khayrallah | ........... H04L 1/0057 714/751 |
| 10,396,821 B2 | * | 8/2019 | Lien | .................. H03M 13/3723 |

(Continued)

*Primary Examiner* — Guerrier Merant
(74) *Attorney, Agent, or Firm* — Taylor English Duma LLP

(57) ABSTRACT

Embodiments herein provide for a controller that is operable to soft read a data bit a plurality of times, to generate a bit set for the data bit from the soft reads, to logically operate on the bit set, and to generate a Hamming weight for the data bit based on the logical operation. The Hamming weight has fewer bits than the bit set and is operable to correct the data bit.

18 Claims, 12 Drawing Sheets

(56) References Cited

U.S. PATENT DOCUMENTS

| | | | |
|---|---|---|---|
| 2012/0207224 A1* | 8/2012 | Chow | H03M 13/1111 |
| | | | 375/240.25 |
| 2013/0073895 A1* | 3/2013 | Cohen | G06F 11/1096 |
| | | | 714/6.2 |
| 2014/0281823 A1* | 9/2014 | Micheloni | H03M 13/1111 |
| | | | 714/773 |
| 2015/0127883 A1* | 5/2015 | Chen | G06F 3/0611 |
| | | | 711/103 |
| 2017/0162268 A1* | 6/2017 | Chen | G11C 11/5642 |
| 2018/0067684 A1* | 3/2018 | Benisty | G06F 11/1048 |
| 2018/0069658 A1* | 3/2018 | Benisty | H03M 13/09 |

* cited by examiner

| Bit Column | Bit 0 | Bit 1 | Bit 2 | Bit 3 | Bit 4 | Bit 5 | Bit 6 | Bit 7 |
|---|---|---|---|---|---|---|---|---|
| T0 | 1 | 0 | 1 | 1 | 0 | 1 | 1 | 1 |

Hard Read Data

| Bit Column | Bit 0 | Bit 1 | Bit 2 | Bit 3 | Bit 4 | Bit 5 | Bit 6 | Bit 7 |
|---|---|---|---|---|---|---|---|---|
| T0 | 0 | 0 | 0 | 0 | 0 | 0 | 0 | 1 |
| T1 | 1 | 0 | 0 | 1 | 0 | 0 | 0 | 1 |
| T2 | 1 | 0 | 1 | 0 | 0 | 0 | 1 | 1 |
| T3 | 1 | 1 | 1 | 1 | 0 | 1 | 1 | 1 |
| T4 | 1 | 1 | 1 | 1 | 0 | 0 | 1 | 1 |
| T5 | 1 | 1 | 1 | 1 | 0 | 0 | 1 | 1 |
| T6 | 1 | 1 | 1 | 1 | 1 | 1 | 1 | 1 |

7 Soft Read Data

*FIG. 3*

|  | Bit 0 | Bit 1 | Bit 2 | Bit 3 | Bit 4 | Bit 5 | Bit 6 | Bit 7 |
|---|---|---|---|---|---|---|---|---|
| Hamming Weights | 110 | 100 | 101 | 101 | 001 | 010 | 101 | 111 |

| | | | | | | | | |
|---|---|---|---|---|---|---|---|---|
| Buffer 2 | 1 | 1 | 1 | 1 | 0 | 0 | 1 | 1 |
| Buffer 1 | 1 | 0 | 0 | 0 | 0 | 1 | 0 | 1 |
| Buffer 0 | 0 | 0 | 1 | 1 | 1 | 0 | 1 | 1 |

*FIG. 5*

| Bit Column | Bit 0 | Bit 1 | Bit 2 | Bit 3 | Bit 4 | Bit 5 | Bit 6 | Bit 7 |
|---|---|---|---|---|---|---|---|---|
| T0 | 0 | 0 | 0 | 0 | 0 | 0 | 0 | 1 |
| T1 | 1 | 0 | 0 | 0 | 0 | 0 | 0 | 1 |
| T2 | 1 | 0 | 1 | 1 | 0 | 0 | 1 | 1 |
| T3 | 1 | 1 | 1 | 1 | 0 | 0 | 1 | 1 |
| T4 | 1 | 1 | 1 | 1 | 0 | 0 | 1 | 1 |
| T5 | 1 | 1 | 1 | 1 | 0 | 1 | 1 | 1 |
| T6 | 1 | 1 | 1 | 1 | 1 | 1 | 1 | 1 |

7 Soft Read Data Sorted

*FIG. 6*

| Bit Column | Bit 0 | Bit 1 | Bit 2 | Bit 3 | Bit 4 | Bit 5 | Bit 6 | Bit 7 |
|---|---|---|---|---|---|---|---|---|
| T0 | 0 | 0 | 0 | 0 | 0 | 0 | 0 | 1 |
| T1 | 1 | 0 | 0 | 0 | 0 | 0 | 0 | 1 |
| T2 | 1→0 | 0 | 1 | 1 | 0 | 0 | 1 | 1 |
| T3 | 1 | 1 | 1 | 1 | 0 | 0 | 1 | 1 |
| T4 | 1→0 | 1 | 1 | 1 | 0 | 0 | 1 | 1 |
| T5 | 1 | 1 | 1 | 1 | 0 | 1 | 1 | 1 |
| T6 | 1→0 | 1 | 1 | 1 | 1 | 1 | 1 | 1 |
| XOR | 0 | 0 | 1 | 1 | 1 | 0 | 1 | 1 |

7 Soft Read Data Sorted 1's Position

FIG. 7

| Bit Column | Bit 0 | Bit 1 | Bit 2 | Bit 3 | Bit 4 | Bit 5 | Bit 6 | Bit 7 |
|---|---|---|---|---|---|---|---|---|
| T0 | 0 | 0 | 0 | 0 | 0 | 0 | 0 | 1 |
| T1 | 1 | 0 | 0 | 0 | 0 | 0 | 0 | 1 |
| T2 | 1 | 0 | 1 | 1 | 0 | 0 | 1 | 1 |
| T3 | 1→0 | 1 | 1 | 1 | 0 | 0 | 1 | 1 |
| T4 | 1 | 1 | 1 | 1 | 0 | 0 | 1 | 1 |
| T5 | 1→1 | 1 | 1 | 1 | 0 | 1 | 1 | 1 |
| T6 | 1 | 1 | 0 | 1 | 1 | 1 | 1 | 1 |
| XOR | 1 | 0 | 0 | 0 | 0 | 1 | 0 | 1 |

7 Soft Read Data Sorted 2's Position

*FIG. 8*

| Bit Column | Bit 0 | Bit 1 | Bit 2 | Bit 3 | Bit 4 | Bit 5 | Bit 6 | Bit 7 |
|---|---|---|---|---|---|---|---|---|
| T0 | 0 | 0 | 0 | 0 | 0 | 0 | 0 | 1 |
| T1 | 1 | 0 | 0 | 0 | 0 | 0 | 0 | 1 |
| T2 | 1 | 0 | 1 | 1 | 0 | 0 | 1 | 1 |
| T3 | 1 | 1 | 1 | 1 | 0 | 0 | 1 | 1 |
| T4 | 1 | 1 | 1 | 1 | 0 | 0 | 1 | 1 |
| T5 | 1 | 1 | 1 | 1 | 0 | 1 | 1 | 1 |
| T6 | 1 | 1 | 1 | 1 | 1 | 1 | 1 | 1 |
| XOR | 1 | 1 | 1 | 1 | 0 | 0 | 1 | 1 |

7 Soft Read Data Sorted 4's Position

FIG. 9

| | Bit 0 | Bit 1 | Bit 2 | Bit 3 | Bit 4 | Bit 5 | Bit 6 | Bit 7 |
|---|---|---|---|---|---|---|---|---|
| Hamming Weights | 110 | 100 | 101 | 101 | 001 | 010 | 101 | 111 |
| Buffer 2 | 1 | 1 | 1 | 1 | 0 | 0 | 1 | 1 |
| Buffer 1 | 1 | 0 | 0 | 0 | 0 | 1 | 0 | 1 |
| Buffer 0 | 0 | 0 | 1 | 1 | 1 | 0 | 1 | 1 |

*FIG. 10*

GENERATING HAMMING WEIGHTS FOR DATA

CROSS REFERENCE TO RELATED APPLICATIONS

This continuation patent application claims priority to, and thus the benefit of an earlier filing date from, U.S. patent application Ser. No. 15/639,828 (filed Jun. 30, 2017), the contents of which are incorporated herewith.

BACKGROUND

Certain error correction techniques use "soft" bits to improve the error correction capability. For example, soft bits are generally redundant forms of hard bits. A soft bit may indicate a reliability of a hard bit read from a storage element. With a flash memory device, a soft bit may be used to indicate reliability of a "hard" bit based on the relative distance between soft read voltage and a threshold read voltage. In whatever form, soft bits may improve decoding by indicating which bits of data are likely to be "incorrect" such that they can be flipped prior to error correction.

SUMMARY

Systems and methods presented herein provide for generating Hamming weights for data. In one embodiment, a controller is operable to soft read a data bit a plurality of times, to generate a bit set for the data bit from the soft reads, to logically operate on the bit set, and to generate a Hamming weight for the data bit based on the logical operation. The Hamming weight has fewer bits than the bit set and is operable to correct the data bit.

The various embodiments disclosed herein may be implemented in a variety of ways as a matter of design choice. For example, the system and method embodiments hereof may take the form of computer hardware, software, firmware, or combinations thereof. Other exemplary embodiments are described below.

BRIEF DESCRIPTION OF THE FIGURES

Some embodiments are now described, by way of example only, and with reference to the accompanying drawings. The same reference number represents the same element or the same type of element on all drawings.

FIGS. 3-10 are tables of data reads and generated hash codes.

DETAILED DESCRIPTION OF THE FIGURES

The figures and the following description illustrate specific exemplary embodiments. It will thus be appreciated that those skilled in the art will be able to devise various arrangements that, although not explicitly described or shown herein, embody the principles of the embodiments and are included within the scope of the embodiments. Furthermore, any examples described herein are intended to aid in understanding the principles of the embodiments and are to be construed as being without limitation to such specifically recited examples and conditions. As a result, the embodiments are not limited to any specific examples described below.

Figure 1:
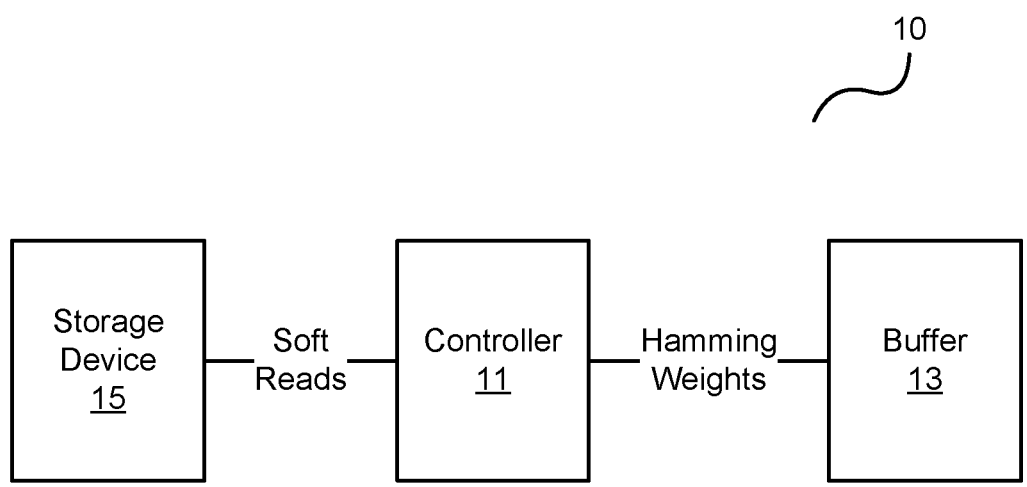
FIG. 1 is a block diagram of an exemplary system for generating hash codes from soft read data.

FIG. 1 is a block diagram of an exemplary system 10 for generating hash codes from soft read data. The system 10 comprises a controller 11 operable to read data from a storage device 15 communicatively coupled thereto. For example, the controller 11 may perform a "hard read" on a storage location of the storage device 15 to extract data therefrom.

To illustrate, the storage device 15 may be non-volatile NAND flash device configured using one or more SSD architectures, such as Single Level Cell (SLC) architectures and Multi-Level Cell (MLC) architectures. An SLC architecture allows a memory cell to store one bit of data. Traditionally, an MLC architecture meant that a memory cell could store two bits of data. But, architectures have evolved and now provide even higher levels of density, such as Triple Level Cell (TLC) architectures that store three bits per memory cell, and Quad Level Cell (QLC) architectures that store four bits per memory cell. Generally, though, any architecture storing more than one bit of data per cell may also be referred to as an MLC architecture.

Typically, each memory cell of a flash device is configured like a Metal Oxide Semiconductor Field Effect Transistor (MOSFET) with a control gate. But, each memory cell also has a floating gate surrounded by an insulating oxide layer configured between the control gate and the channel of the MOSFET. Because the floating gate is electrically isolated by its insulating layer, electrons placed on it are trapped until they are removed by an application of an electric field (e.g., an applied voltage). Placing electrons on the floating gate sets the transistor to the logical "0" state. Once the floating gate is charged, the electrons in it screen the electric field from the control gate, thereby increasing the threshold voltage of the memory cell. This means that a higher voltage is applied to the control gate to make the channel of the transistor conductive.

In order to write a value from the transistor, an intermediate voltage between the threshold voltages is applied to the control gate. If the channel conducts at this intermediate voltage, the floating gate is uncharged and causes a logical "1" to be stored in the memory cell. If the channel does not conduct at the intermediate voltage, it indicates that the floating gate is charged causing a logical "0" to be stored in the memory cell. The presence of a logical "0" or a logical "1" is sensed, or "hard read", by determining whether there is current flowing through the transistor when the intermediate voltage is asserted on the control gate.

Of course, hard reads can be performed on any variety of storage devices, persistent or volatile, including, a magnetoresistive random-access memory devices, magnetic disks, Random Access Memories (RAMs, such as DRAMs), or various combinations thereof.

However, certain factors, such as ambient temperature, age/wear of the storage device 15, age of data in the storage device 15, etc., can impair the controller 11's ability to correctly read the data from the storage device 15. Thus, the hard read data may comprise errors. These errors can usually be corrected with error correction coding (ECC). But, to improve the odds of correctly reading the data, the controller 11 may, alternatively or additionally, perform a series of "soft reads" on individual bits of data stored within the storage device 15 and, based on a log likelihood ratio (LLR), estimate the bits that are read. Then, the controller 11 can "flip" hard read bits that are believed to be in error such that ECC processing can be reduced.

Using the SSD example, the controller 11 may apply a series of different voltages on the control gate to produce estimates of the bits. For example, the controller 11 may apply a first voltage to the control gate of a memory cell to extract a bit from the memory cell and then apply a second different voltage to the control gate of the memory cell to extract that bit. Then, from those two soft reads, the controller 11 may estimate the likelihood that the bid has been correctly read. If the bit is believed to be in error, then the controller can flip the hard read bit before error correction.

Typically though, the controller 11 will do a soft read of a bit multiple times (e.g., more than twice) to improve the estimates of that bit. However, in certain systems, such as those implementing parity decoding using a bit-redundancy based protocol (e.g., a low-density parity check), there are typically hardware restrictions on the amount of redundancy that can be applied to each bit, even though it is desirable to use a larger set of bit-redundancy than the hardware can decode. Therefore, converting a larger set of data into a smaller set of data that the hardware is capable of interpreting would be advantageous. Still, a "brute force" calculation of individual bits is impractical due to the excessive computation time involved.

The controller 11 is operable to estimate multiple bits at a time with significantly lower overall memory accesses and instructions than previous methods by generating Hamming weights from the soft read bits. The controller 11 may then use those Hamming weights to compute the estimates through the use of an LLR table. The system may also employ a buffer 13 to store the computed Hamming weights while the controller 11 estimates the bits associated with those Hamming weights. These Hamming weights, however, occupy less memory than would be used by storage of multiple soft reads used in the bit estimates.

Based on the foregoing, the controller 11 is any device, system, software, firmware, or combination thereof operable to read data from the storage device 15. The storage device 15 is any device capable of storing data, persistent or otherwise. Examples of the storage device 15 include NAND flash memory devices, a magnetoresistive random-access memory devices, magnetic disks, Random Access Memories (RAMs, such as DRAMs), or various combinations thereof. The buffer 13 is any device, system, software, firmware, or combination thereof operable to temporarily store the Hamming weights and any data relating thereto. Examples of the buffer 13 include RAM devices, such as DRAM devices.

Figure 2:
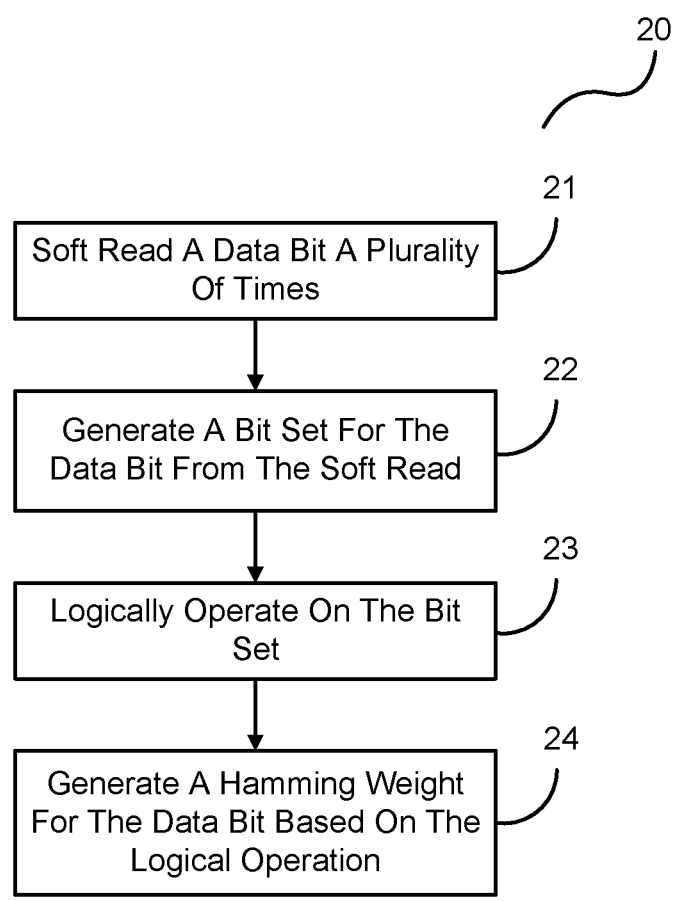
FIG. 2 is a flowchart of an exemplary process of the system of FIG. 1.

FIG. 2 is a flowchart of an exemplary process 20 of the system 10 of FIG. 1. In this embodiment, the controller 11 soft reads the data bit a plurality of times, in the process element 21. In this regard, the controller 11 generates a bit set for the soft read data bit, in the process element 22. For example, assume that the controller 11 reads a bit of data from the storage device 15 five times. The controller 11 may then generate a bit set of five bits from that bit of data. From there, the controller 11 logically operates on the bit set, in the process element 23, and generates a Hamming weight for the data bit based on the logical operation, in the process element 24. For example, the controller 11 may XOR various combinations of soft read bits in the bit set to generate the Hamming weights.

FIGS. 3-9 are tables of data reads and generated hash codes used as an example to illustrate the operation of the controller 11. In this exemplary embodiment, the controller 11 performs a hard read on eight data bits, labeled bit 0-bit 7 in bit column T0, as illustrated in FIG. 3. This hard read is an initial read of the storage device 15 in which bits that are in error may be corrected with ECC. To assist in evaluating the likelihood of bits being in error, the controller 11 also performs a plurality of soft reads of the same bits. For example, certain bits from the hard read data may be in error. By performing multiple soft reads of the same bits of the hard read data, bits that are in error in the hard read data can be flipped after an evaluation of the soft reads. This can assist in reducing the amount of ECC used to correct the hard read errors.

As an example, assume that two of the hard read data bits are in error. By performing multiple soft reads of the same data and evaluating the LLRs of those bits being in error, the two hard read data bits may be flipped to correct the errors, potentially eliminating the need for ECC and ECC processing.

Returning to the soft reads of the exemplary embodiment, the controller 11 reads each of the eight data bits (bit 0-bit 7) seven times, thus producing seven estimates of each bit. For example, after soft reading bit 0 seven times, the controller 11 stores a column of reads T0-T6 in the buffer 13 as 0111111. The seven soft reads of bit 1 are stored in the buffer as 0001111, the seven reads of soft bit 2 are stored in the buffer 13 as 0011111, and so on.

Figure 4:
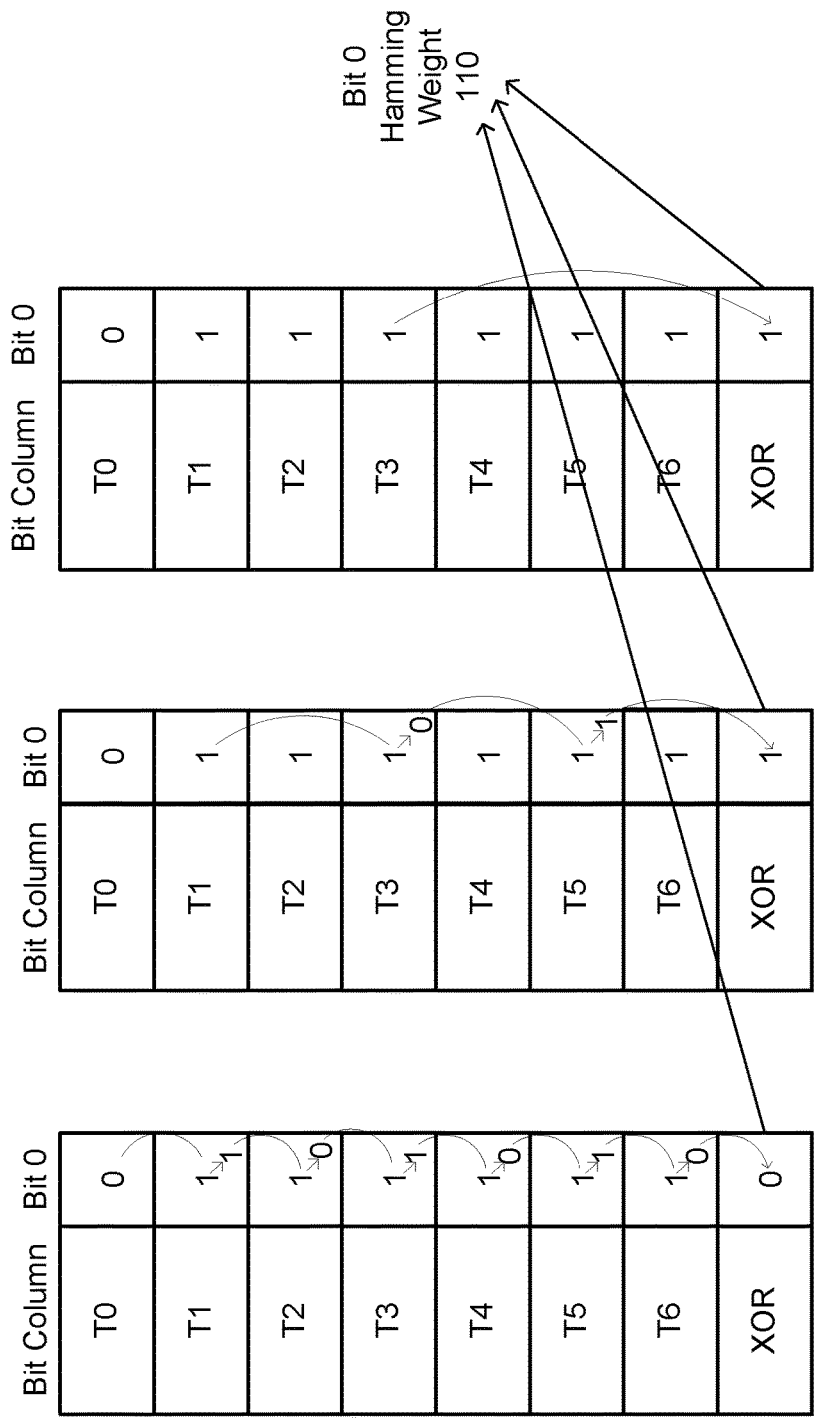

After the seven soft reads of bits 0-7, the controller 11 may perform a logical operation on each bit column to generate a Hamming weight for each hard read bit. For example, the controller 11 may XOR each soft read bit (T0-T6) of bit 0 to produce a first Hamming bit (e.g., the 1's position, or least significant bit, "LSB"), as illustrated in FIG. 4. The controller 11 then XORs the soft reads T1, T3, and T5 of bit 0 to produce a second Hamming bit (e.g., the 2's position). And then the controller 11 uses the soft read T3 of bit 0 as the third Hamming bit (e.g., the 4's position, or most significant bit, "MSB"). In such an embodiment, the controller 11 would produce a Hamming weight of 110.

More specifically, the bit position of the Hamming weight is equal to the spacing of the buffers to XOR. For example, the T0 bit position (1's bit) has every buffer XORed, the T1 bit position (2's bit) has every other buffer XORed, the T2 bit position has every 4th buffer XORed, etc.

The resulting Hamming weights for each of the bit columns of bits 0-7 are illustrated in FIG. 5. Once computed, the controller 11 stores the bits of the Hamming weights in the buffers 0-2 of the buffer 13, thereby reducing the number of buffers of the seven soft reads T0-T6 to three.

However, bit columns (e.g., bit 0 column, soft reads T0-T6) may contain irregular patterns (e.g., due to value switching more than once) and may end up with an incorrect Hamming weight representation. While this may be unavoidable, the controller 11 may mitigate such by noting that each bit position can actually be achieved by XORing groups of buffers that have been logically ORed together, increasing the likelihood of a correct result in bit positions beyond the 1's position. In other words, the controller 11 may soft read another data bit a same plurality of times, generate another bit set for the other data bit from the soft read of the other data bit, logically operate on the bit set with the other bit set, and correct the data bit based on the logical operation of the bit sets.

Alternatively, each bit column may be sorted. For example, each of the bit 0-bit 7 column of soft reads T0-T6 may be sorted using a "bead sort" algorithm, as illustrated in FIG. 6. The sorting algorithm results in a change to the structure of bit columns bit 3 and bit 5 with respect to that illustrated in FIG. 3, in this example. From there, the controller 11 performs a logical operation on each of the bead sorted bit columns bit 0-bit 7 of the soft reads T0-T6, as illustrated in FIGS. 7-9 and described above. The resulting Hamming weights for each of the bead sorted bit columns of bits 0-7 is illustrated in FIG. 10. Once computed, the controller 11 stores the bits of the Hamming weights in the buffers 0-2 of the buffer 13, again reducing the number of buffers of the seven soft reads T0-T6 to three.

Although the alternative bead sorting approach yielded the same Hamming weight results as the unsorted approach in this example, those skilled in the art should readily recognize that the bead sorting approach could produce different results as the bits that are logically operated on change positions. Additionally, it should be noted that this example is not intended to limit the scope of the embodiment. For example, the controller 11 may perform any number of soft reads on any number of bits from the storage device 15. The example merely illustrates one 8-bit embodiment that is typical in data storage and how the controller 11 can perform a number of soft reads and reduce that to a smaller data set of Hamming weights that reduces memory accesses and instructions while improving soft decodes of bits.

Figure 11:
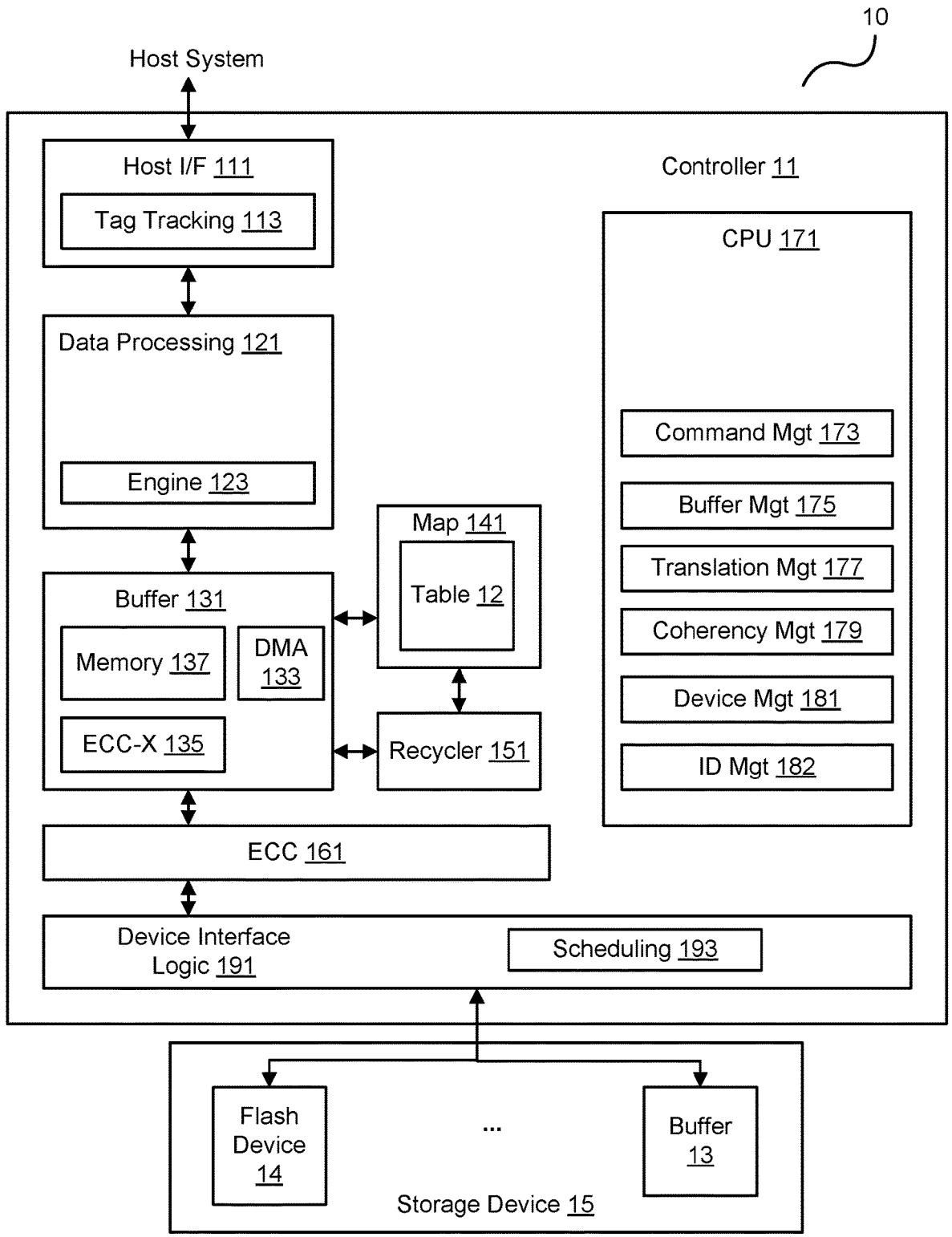
FIG. 11 is a block diagram of an exemplary storage controller and its associated storage device.
Figure 12:
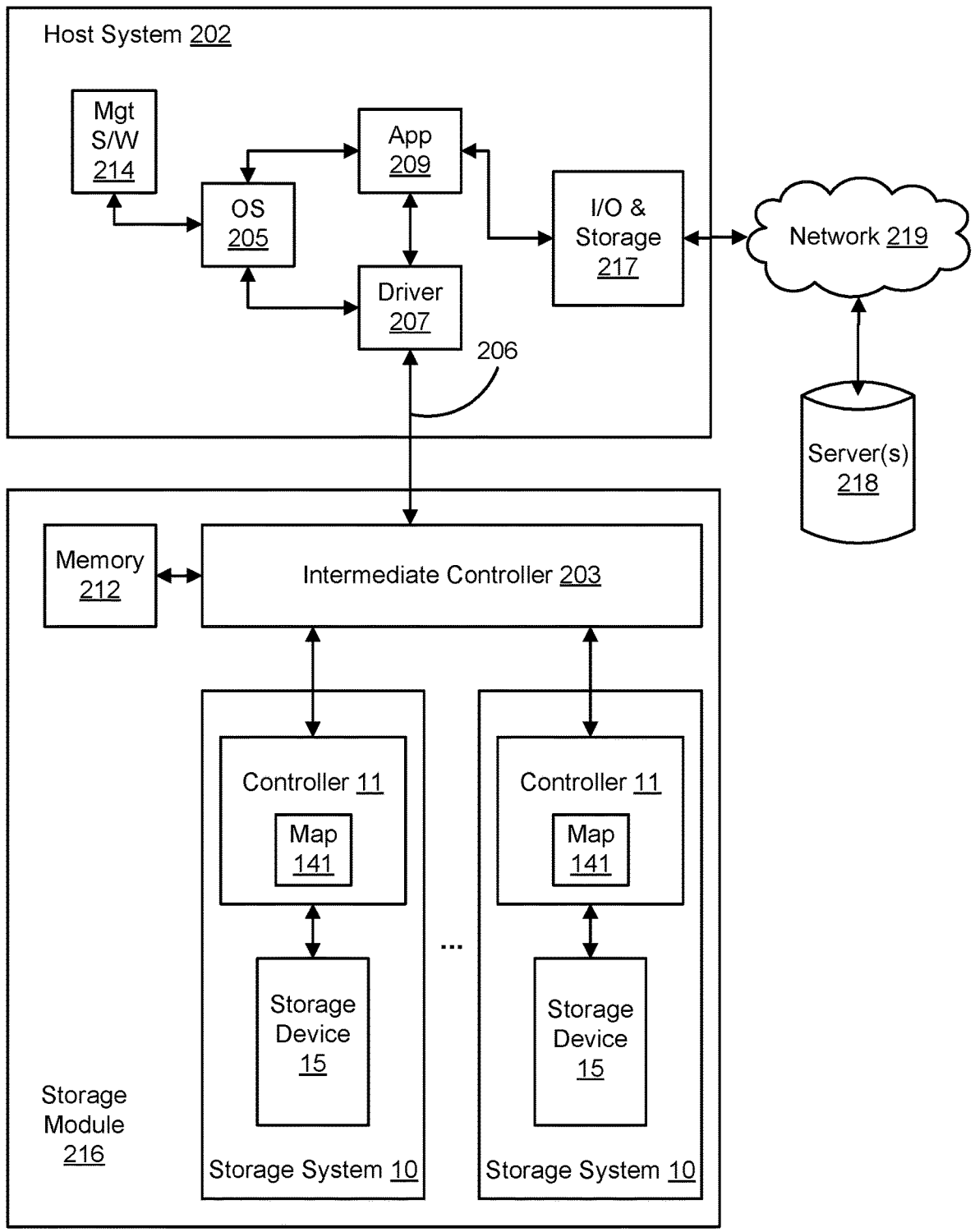
FIG. 12 is a block diagram of an I/O module comprising storage devices and their associated controllers interfacing with a host system.

The embodiments herein can take the form of hardware, firmware, software, or a combination thereof. FIGS. 11 and 12 illustrate such a combination that may be operable to employ the systems and methods described herein. More specifically, FIG. 11 is a block diagram of an exemplary storage system 10 and its associated device controller (e.g., the controller 11) and storage device 15 (e.g., comprising flash devices 14). FIG. 12 is a block diagram of a storage module 216 comprising storage systems 10 and their associated controllers 11/storage devices 15 interfacing with a host system 502.

In FIG. 11, the controller 11 includes a host interface 111 that is operable to interface with a host system to communicate I/O operations of the host system. The host interface 111 may be configured with a tag tracking module 113 that is operable to track progress of individual I/O commands (e.g., read and write commands to certain addresses in the storage device 15). The tag tracking module 113 may associate an external flag of a command received from the host system with an internal flag that the controller 11 can access during processing of the command to identify the status of the processing.

The controller 11 also includes a data processing module 121 that comprises a processing engine 123 generally operable to perform certain tasks on data that is received from the host interface 111 or residing within a buffer 131, such as one or more of formatting the data, transcoding the data, compressing the data, decompressing the data, encrypting the data, decrypting the data, data encoding/formatting, or any combination thereof. For example, a processing engine 123 of the data processing module 121 may be operable to process the I/O operation from an I/O module of the host system generating the operation, such that the data of the I/O operation may be written to the logical address of the storage device 15. The processing engine 123 may extract the data of the write I/O command and prepare it for storage in the storage device 15. In doing so, the processing engine 123 may compress the data using any of a variety of data compression algorithms. When retrieving the data from the storage device 15, the processing engine 123 may decompress the data according to the algorithm used to compress the data for storage.

The buffer 131 is operable to store data transferred to and from the host system. The buffer 131 may also store system data, such as memory tables used by the controller 11 to manage the flash device 14, the buffer 13, and any possible higher-level RAID functionality in the memory 137. Other modules may include an error correcting code (ECC-X) module 135 to provide higher-level error correction and redundancy functionality, and a Direct Memory Access (DMA) module 133 to control movement of data to and from the buffer 131.

The controller 11 also includes an error correction code module 161 operable to provide lower level error correction and redundancy processing of the data in the buffer 131 using any of a variety of error correction codes techniques (e.g., cyclic redundancy checks, Hamming codes, low-density parity check coders, etc.).

A device interface logic module 191 is operable to transfer data to and from the storage device 15 according to the protocol of the devices therein. The device interface logic module 191 includes a scheduling module 193 that is operable to queue I/O operations to the storage device 15.

The controller 11 herein also includes a map module 141 that is operable to perform data addressing to locations in the storage device 15 according to the lookup table 12. For example, the map module 141 may use the lookup table 12 to convert logical block addresses (LBAs) from the host system to block/page addresses directed to the buffer 13, the flash device 14, or both. The lookup table 12 may be stored in whole or in part in controller 11 and/or in storage device 15. For example, in some embodiments a portion of the lookup table 12 may be cached in the controller 11 with generally all of lookup table 12 being stored non-volatilely in the storage device 15.

A recycler 151 performs garbage collection on behalf of the controller 11. For example, the recycler 151 may determine portions of the storage device 15 that are actively in use by scanning the lookup table 12 of the map module 141. In this regard, the recycler 151 may make unused, or "deallocated", portions of the storage device 15 available for writing by erasing the unused portions. The recycler 151 may also move data within the storage device 15 to make larger contiguous portions of the storage device 15 available for writing.

The controller 11 also includes a CPU 171 that controls various aspects of the controller 11. For example, the CPU 171 may process instructions or firmware to implement command management 173 that tracks and controls commands received from the host system. This firmware may also implement buffer management 175 that controls allocation and use of the buffer 131 and translation management 177 or to control the map module 141. The firmware may also employ coherency management 179 to control consistency of data addressing to avoid conflicts such as those that may occur between external data accesses and recycled data accesses. The firmware may also provide device management 181 to control the device interface logic module 191 and identity management 182 to control modification and communication of identity information of components within the controller 11.

In FIG. 12, the host system 202 is operable to process software instructions and perform I/O operations with the storage module 216 to read from and write to one or more storage systems 10. In this regard, the host system 202 may include an operating system 205 that provides the computing environment for the host system 202. A driver 207 is operable to communicate through the link 206 to the storage module 216 to perform the I/O operations with the various storage systems 10 configured therewith.

Like other computing systems, the operating system 205 may be initiated via management software 214 (e.g., Bios software). The host system 202 may also include application software 209 to perform various computing processes on behalf of the host system 202 (e.g., word processing applications, image processing applications, etc.). The host system 202 may also include I/O and storage functionality 217 operable to conduct I/O operations with one or more servers 218 through a communication network 219 (e.g., the Internet, local area networks, wide-area networks, etc.). In this regard, the storage module 216 may act as a cache memory of I/O operations for the host system 202.

The storage module 216 may be configured with an intermediate controller 203 that is operable to switch various I/O operations of the host system 202 to LBAs of the storage systems 10. In this regard, the storage module 216 may include a memory 212 that stores mapping information for the intermediate controller 203 to conduct the I/O operations to the LBAs. The map module 141 of the controller 11 may also be operable to perform data addressing with variable-sized mapping units to locations in the storage device 15 according to the lookup table 12, and convert LBAs from the host system 202 to block/page addresses directed to the storage device 15.

What is claimed is:

1. A system, comprising:
a storage device;
a buffer; and
a controller communicatively coupled to the storage device and the buffer and operable to:
soft read a data bit from a storage location of the storage device a plurality of times,
generate a bit set for the data bit from the soft reads,
logically operate on the bit set to generate a Hamming weight for the data bit, the Hamming weight having fewer bits than the bit set,
store the Hamming weight for the bit in the buffer, and
utilize the Hamming weight in the buffer to correct the data bit.

2. The system of claim 1, wherein:
the controller is further operable to bead sort bits of the bit set before generating the Hamming weight.

3. The system of claim 1, wherein:
the controller is further operable to soft read the data bit from the storage device by changing a read voltage level of the data bit by the plurality of times.

4. The system of claim 1, wherein:
the storage device is a NAND flash memory device, a magnetoresistive random-access memory device, or a combination thereof.

5. The system of claim 1, wherein:
the controller is further operable to logically XOR bits of the bit set to generate the Hamming weight.

6. The system of claim 1, wherein:
the storage device is a hard disk drive.

7. A method, comprising:
soft reading a data bit from a storage location of a storage device a plurality of times;
generating a bit set for the data bit from the soft reads;
logically operating on the bit set to generate a Hamming weight for the data bit, the Hamming weight having fewer bits than the bit set;
storing the Hamming weight in a buffer in lieu of the bit set; and
correcting the data bit utilizing the Hamming weight from the buffer.

8. The method of claim 7, further comprising:
bead sorting bits of the bit set before generating the Hamming weight.

9. The method of claim 7, wherein:
soft reading the data bit a plurality of times comprises changing a read voltage level for each read.

10. The method of claim 7, wherein:
the storage device is a NAND flash memory device, a magnetoresistive random-access memory device, or a combination thereof.

11. The method of claim 7, further comprising:
logically XORing bits of the bit set to generate the Hamming weight.

12. A non-transitory computer readable medium comprising instructions that, when executed by a controller of a storage system, direct the controller to:
soft read a data bit from a storage location of a storage device of the storage system a plurality of times;
generate a bit set for the data bit from the soft reads;
logically operate on the bit set to generate a Hamming weight for the data bit, the Hamming weight having fewer bits than the bit set;
store the Hamming weight in a buffer; and
correct the data bit utilizing the Hamming weight from the buffer.

13. The computer readable medium of claim 12, further comprising instructions that direct the controller to:
bead sort bits of the bit set.

14. The computer readable medium of claim 12, wherein:
the instructions further direct the controller to soft read the data bit the plurality of times while changing a read voltage level of the bit for each read.

15. The computer readable medium of claim 12, wherein:
the storage device is a NAND flash memory device, a magnetoresistive random-access memory device, or a combination thereof.

16. The computer readable medium of claim 12, further comprising instructions that direct the controller to:
logically XOR bits of the bit set to generate the Hamming weight.

17. The system of claim 5, wherein the controller is operable to XOR each bit of the bit set to produce a first Hamming bit of the Hamming weight, the bits of a 2's position of the bit set to produce a second Hamming bit of the Hamming weight, and the bits of a 4's position of the bit set to produce a third Hamming bit of the Hamming weight.

18. The system of claim 1, wherein correcting the data bit utilizing the Hamming weight in the buffer comprises using the Hamming weight to compute an estimate of the bit through an log likelihood ratio (LLR) table.

* * * * *